(12) United States Patent
Klein et al.

(10) Patent No.: US 6,186,800 B1
(45) Date of Patent: Feb. 13, 2001

(54) CIRCUIT BOARD GROUNDING AND SUPPORT STRUCTURE

(75) Inventors: Dean A. Klein; Michael V. Leman, both of Eagle, ID (US)

(73) Assignee: Micron Electronics, Inc., Boise, ID (US)

(*) Notice: Under 35 U.S.C. 154(b), the term of this patent shall be extended for 0 days.

(21) Appl. No.: 09/231,306

(22) Filed: Jan. 13, 1999

(51) Int. Cl.[7] .................................................. H01R 13/648
(52) U.S. Cl. .............................. 439/95; 174/51; 361/758
(58) Field of Search ...................... 439/95, 92, 552; 174/51; 24/295, 453; 361/816, 789, 742, 753, 758, 767, 770, 804, 825

(56) References Cited

U.S. PATENT DOCUMENTS

| | | | |
|---|---|---|---|
| 3,066,367 | 12/1962 | Garman | 24/81 |
| 3,777,052 | * 12/1973 | Fegen | 174/138 D |
| 3,996,500 | 12/1976 | Coules | 317/101 |
| 4,389,759 | 6/1983 | Yuda | 24/214 |
| 4,495,380 | 1/1985 | Ryan et al. | 174/138 |
| 4,627,760 | 12/1986 | Yagi et al. | 403/201 |
| 4,674,910 | 6/1987 | Hayashi | 403/408.1 |
| 4,701,984 | 10/1987 | Wyckoff | 24/573 |
| 4,855,873 | 8/1989 | Bhargava et al. | 361/424 |
| 4,901,205 | 2/1990 | Landis et al. | 361/424 |
| 4,938,703 | * 7/1990 | Nakano | 439/74 |
| 4,954,087 | * 9/1990 | Lauks et al. | 439/71 |
| 5,085,589 | 2/1992 | Kan | 439/92 |
| 5,138,529 | * 8/1992 | Colton et al. | 361/424 |
| 5,164,916 | 11/1992 | Wu et al. | 365/52 |
| 5,191,513 | 3/1993 | Sugiura et al. | 361/399 |
| 5,218,760 | 6/1993 | Colton et al. | 29/845 |
| 5,225,629 | 7/1993 | Garrett | 174/35 |
| 5,241,451 | 8/1993 | Walburn et al. | 361/785 |
| 5,267,125 | 11/1993 | Liu | 361/816 |
| 5,452,184 | 9/1995 | Scholder et al. | 361/799 |
| 5,467,254 | 11/1995 | Brusati et al. | 361/799 |
| 5,490,038 | 2/1996 | Scholder et al. | 361/759 |
| 5,513,996 | 5/1996 | Annerino et al. | 439/95 |
| 5,519,169 | * 5/1996 | Garrett et al. | 174/35 |
| 5,537,294 | 7/1996 | Siwinski | 361/753 |
| 5,563,450 | 10/1996 | Bader et al. | 257/785 |
| 5,647,748 | 7/1997 | Mills et al. | 439/81 |
| 5,689,863 | 11/1997 | Sinozaki | 24/297 |
| 5,691,504 | 11/1997 | Sands et al. | 174/35 |
| 5,707,244 | 1/1998 | Austin | 439/95 |
| 5,754,412 | * 5/1998 | Calvin | 361/804 |
| 5,758,987 | 6/1998 | Frame et al. | 403/298 |
| 5,786,989 | * 7/1998 | Kawabe | 361/759 |
| 5,796,593 | 8/1998 | Mills et al. | 361/801 |
| 5,833,480 | 11/1998 | Austin | 439/95 |
| 6,017,246 | * 1/2000 | Hisazumi et al. | 439/637 |

* cited by examiner

*Primary Examiner*—Brian Sircus
(74) *Attorney, Agent, or Firm*—Paul A. Revis

(57) ABSTRACT

The present invention provides for an apparatus for grounding and supporting a circuit board such as a motherboard in the chassis of a computer. The apparatus enables use of either a specially manufactured motherboard or an off-the-shelf motherboard in a standardized chassis. Embodiments of the apparatus provided for use with specially manufactured motherboards allow for grounding and support of the motherboard without the use of conventional fasteners such as screws that require tools for installation and removal.

23 Claims, 9 Drawing Sheets

CIRCUIT BOARD GROUNDING AND SUPPORT STRUCTURE

TECHNICAL FIELD

The present invention is directed toward an apparatus and method for providing both grounding and support for a printed circuit board in a computer system.

BACKGROUND OF THE INVENTION

There are two critical aspects of effectively connecting a computer component such as a printed circuit board to a computer system. First, a circuit board must be correctly electrically connected and grounded. Second and concurrently, the circuit board must be securely mechanically connected. For the sake of efficiency and the reduction of the number of required assembly parts, electrical grounding connection and mechanical connection have commonly been accomplished with the same assembly parts. A typical printed circuit board electrically grounded and mechanically connected within a computer system is a motherboard.

Electrical grounding of a computer chassis and the circuit boards within the chassis is essential to the optimal operation of a computer system. Grounding of an individual circuit board within the computer system allows a ground conductor material within a circuit board to block the electromagnetic interference (EMI) generated by the circuit board from interfering with other circuit boards within the computer system. A ground conductor is formed into a circuit board during circuit board fabrication. The ground conductor is a conductive element that extends across a planar portion of the circuit board. The ground conductor serves to electrically decouple EMI or cross-talk between electric devices on opposing sides of the ground conductor. By including a ground conductor in the circuit boards of a computer system, EMI among circuit boards can be reduced. In order for a ground conductor within a circuit board to be effective, the circuit board must be well connected to a ground source.

A typical ground source for a computer system is the ground supply of a building's electrical grid. The building's ground source is usually accessed through a standard wall socket. A computer power cord provides an electrical connection between the ground supply and the computer system. A ground wire of the power cord is in turn connected to the computer chassis of the computer system. Grounding of the computer circuit boards is accomplished by making an electrical connection between each circuit board and the computer chassis.

Additionally, grounding of the entire chassis provides protection to the circuit boards within the chassis. The grounded chassis not only protects a user from shock when touching a chassis energized by a short circuit, but also shields the circuit boards within the grounded chassis from EMI generated by external sources. In addition, the grounded chassis reduces electromagnetic emissions created by the computer circuit boards from interfering with other electrical devices located around the computer system by blocking those emissions.

Generally, mechanical connection of a computer circuit board to a computer chassis is designed to accomplish two goals. First, the connection should be adequately secure to prevent the circuit board from becoming dislodged under anticipated mechanical service loads. Second, the means for making the connection should be easily operable so that the circuit board may be efficiently installed in the computer system upon initial manufacture and so that removal and replacement of the circuit boards for the purpose of maintenance can be accomplished with reduced effort.

A conventional method of attaching computer circuit boards includes the use of screws. A screw can be placed through a hole in the circuit board, and thereby secure the circuit board to a part of a chassis. This type of connection also provides electrical connection when the screw urges a conductive surface of the circuit board onto a conductive part of the chassis. Connection with screws is not, however, considered an optimal method of connection. Screws require relatively large amounts of time to install and remove. A loose screw that is misplaced within a computer chassis can cause great damage to the circuit boards by shorting between circuits not intended to make electrical contact. Additionally, if a screw is misdirected by an installer and the screw is forced against a portion of the circuit board, damage to the circuit board may be caused.

It is efficient for the manufacturer of computer systems to standardize the manufacturing process to the greatest extent possible while still meeting customer demands. An area where it is particularly advantageous to achieve standardization is in the production of computer chassises and cases. It is a goal in the design of computer chassises that the chassises be able to accommodate as many different varieties of circuit boards as possible with a minimum amount of refitting. Circuit boards for a computer may be merely bought and assembled by a computer manufacturer. Alternatively, the circuit boards may be manufactured by or specially made for a computer manufacturer who then assembles the parts into a computer system. It is advantageous to produce a computer chassis that is capable of receiving standard manufactured circuit boards as well as circuit boards specially manufactured for or by a computer manufacturer.

Many means have been developed by computer manufacturers for effectively electrically grounding and mechanically attaching computer circuit boards such as the motherboard of a computer. Some of these means provide for efficient attachment of a customized motherboard to a chassis without the use of screws as fasteners. However, when standard off-the-shelf motherboards rather than specially manufactured motherboards are used in a computer system, it is conventional in the art to provide a different or modified chassis capable of receiving a standard connection by the use of one or more screws.

An improved device would be capable of electrically connecting a variety of motherboards to a standard chassis. The connection would provide adequate electrical grounding and a secure mechanical attachment. When used with some types of specially manufactured motherboards, the connection could be made without the use of screws or other fasteners that require tools to attach or remove. Additionally, the same chassis could be employed with off-the-shelf motherboards. When used with the off-the-self motherboard, screws may be used to connect the motherboard to the standard chassis. By such an arrangement, an improved device would provide both versatility and an enhanced means of operation whenever possible.

SUMMARY OF THE INVENTION

An embodiment of the invention is a circuit board grounding and support structure. The structure has a bracket coupled to a circuit board for supporting the circuit board and a mounting boss around which the bracket slidably engages. The mounting boss is located on only one side of the circuit board when the mounting boss is engaged with the bracket. In some embodiments of the invention, the bracket includes a tab having a first end. The tab is for coupling the bracket to the circuit board. The first end of the tab may be deformed to create a fixed coupling between the tab and the circuit board. In other embodiments of the invention, the bracket includes a hook for coupling to the circuit board. The hook has a notch greater than the thickness of the circuit board for slidably coupling with the circuit board.

In another embodiment of the invention, the bracket of the grounding and support structure includes a shear tab extending from a first surface. The shear tab is for coupling with a shear tab slot in the circuit board.

In still another embodiment of the invention, the bracket of the grounding and support structure includes a second surface extending substantially perpendicularly from a first surface. The bracket also has a shear tab extending from a second surface. The shear tab is for coupling with a shear tab slot in the circuit board. Additionally, there may be a third surface extending substantially perpendicularly from the first surface on the opposite side of the first surface from the second surface. In an embodiment of the invention the third surface includes a compression hook for coupling with a hook slot in the circuit board.

Embodiments of the invention provide for a first end of the mounting boss that contacts the circuit board to provide an electrical connection between the mounting boss and the circuit board. Some embodiments of the invention provide electrical connection between the bracket and the circuit board for providing electrical grounding to the bracket.

Yet another embodiment of the invention includes: a chassis coupled to the mounting boss for providing mechanical support and electrical connectivity for said mounting boss, a power supply mechanically connected to the chassis and electrically connected to the chassis by a ground connection, a central processing unit coupled to the circuit board, and a memory module electrically connected to the central processing unit.

Embodiments of the invention provide: a means for coupling a circuit board to a bracket; a means for slidably engaging the bracket with a mounting boss to support the bracket and circuit board; and a means for attaching the mounting boss to a computer chassis to provide mechanical support and electrical connectivity for the mounting boss.

Still another embodiment of the invention is a method of grounding and supporting a circuit board including the acts of: inserting a first end of a tab of a bracket through a circuit board; deforming the first end of the tab to create a fixed coupling between the tab and the circuit board; sliding the bracket and circuit board onto a mounting boss to engage the bracket and the circuit board with the mounting boss.

Another embodiment of the invention is method of grounding and supporting a circuit board including the acts of: inserting a first portion of a bracket through a circuit board; moving the bracket in the circuit board until a second portion of the bracket locks into a slot in the circuit board to create a fixed coupling between the bracket and the circuit board; and sliding the bracket and circuit board onto a mounting boss to engage the bracket and the circuit board with the mounting boss.

DETAILED DESCRIPTION OF THE INVENTION

Figure 1:
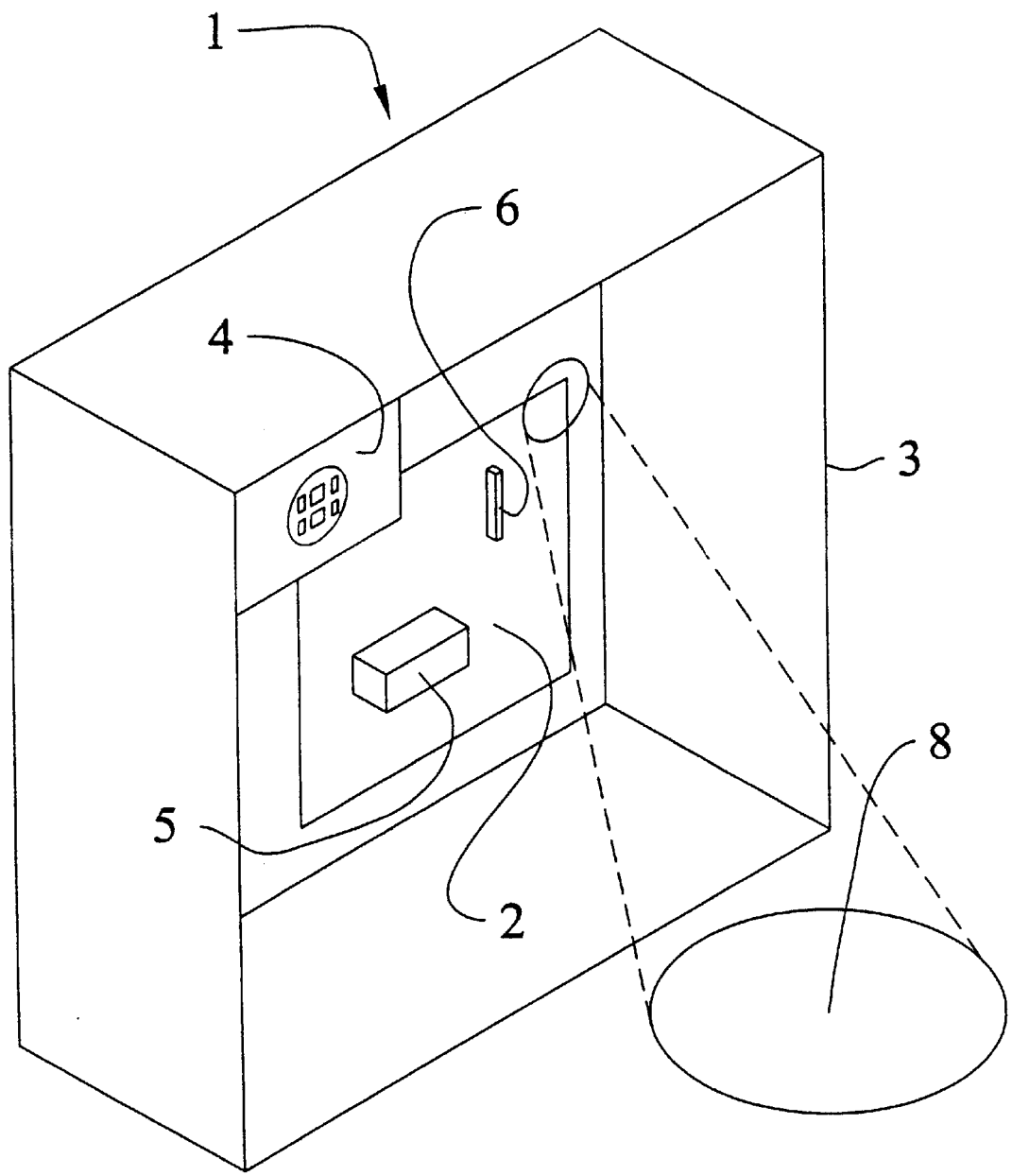
FIG. 1 is a perspective view of an embodiment of the invention showing the location of the grounding and support structure and other components of embodiments of the invention.

Embodiments of the present invention are directed toward an apparatus and method for grounding and supporting a circuit board, such as a motherboard, of a computer system. FIG. 1 shows a computer system 1 with a motherboard 2, a chassis 3, a power supply 4, a central processing unit 5, and a memory module 6. A circular area labeled 8 in FIG. 1 illustrates the orientation and enlarged scale of embodiments of the invention shown in FIGS. 2, 4, 5, 7, and 8.

Description of a First Embodiment of the Invention

Figure 2:
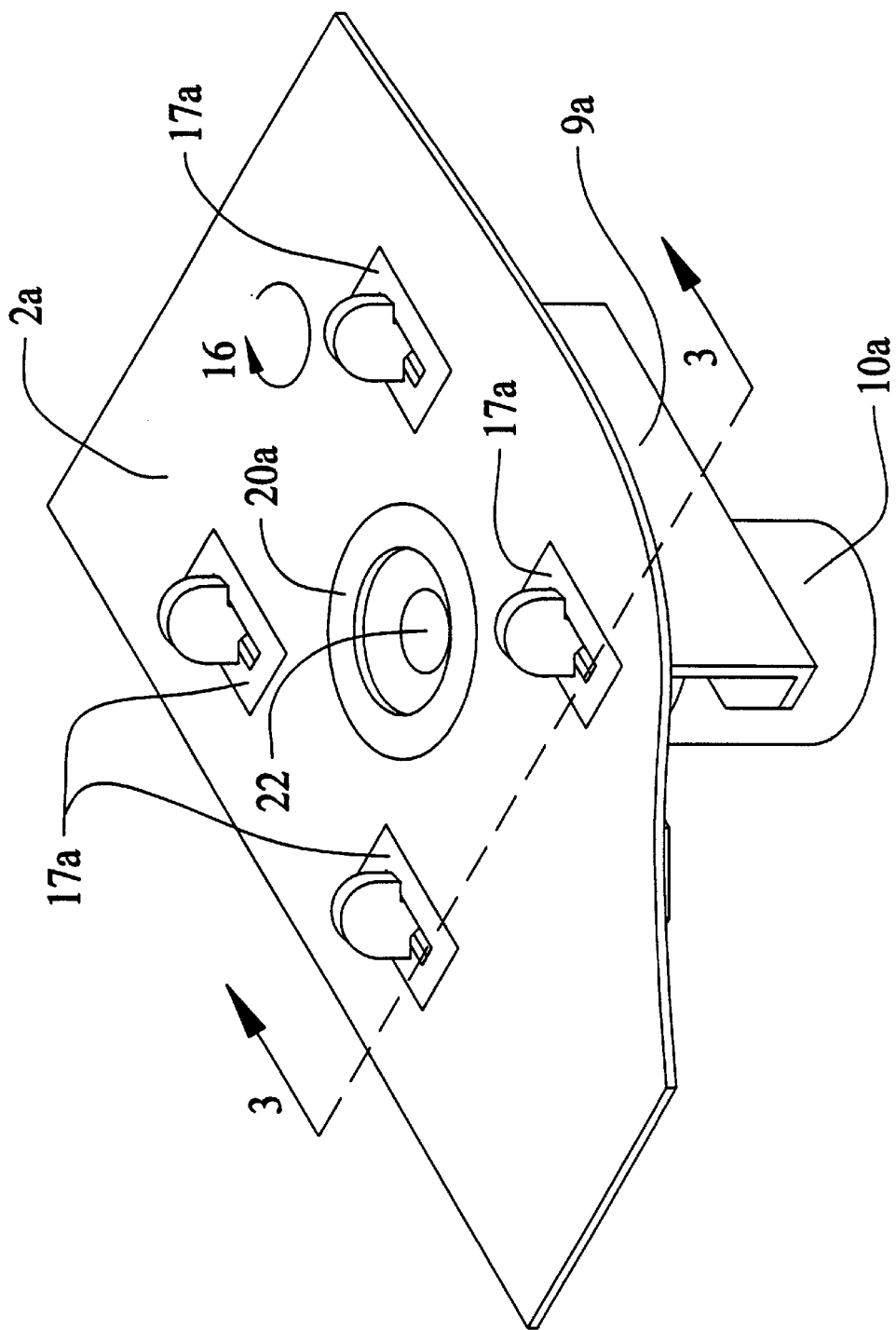
FIG. 2 is a perspective view of an embodiment of the apparatus.

FIG. 2 shows a bracket 9a coupled to a motherboard 2a to support the motherboard. The motherboard 2a may be any kind of circuit board, but in this embodiment is a motherboard. Additionally, a mounting boss 10a is illustrated. The bracket 9a slidably engages around the mounting boss 10a. The term around as used herein to describe the engagement of the mounting boss and the bracket means on the periphery of, but not necessarily encircling completely. The mounting boss 10a is located on only one side of the motherboard 2a when the mounting boss is engaged with the bracket 9a.

Bracket

Figure 3:
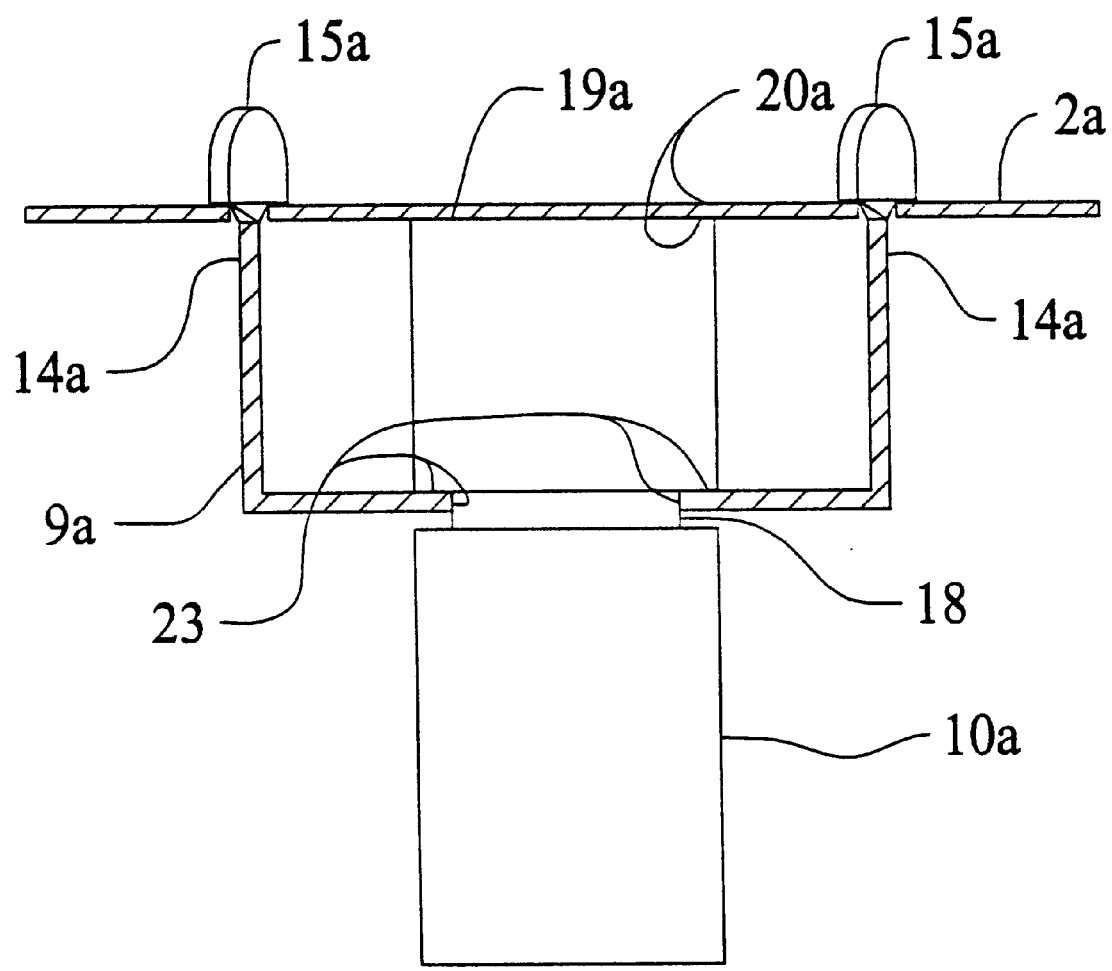
FIG. 3 is a cross-sectional elevation view through section 3—3 as drawn in FIG. 2.
Figure 4:
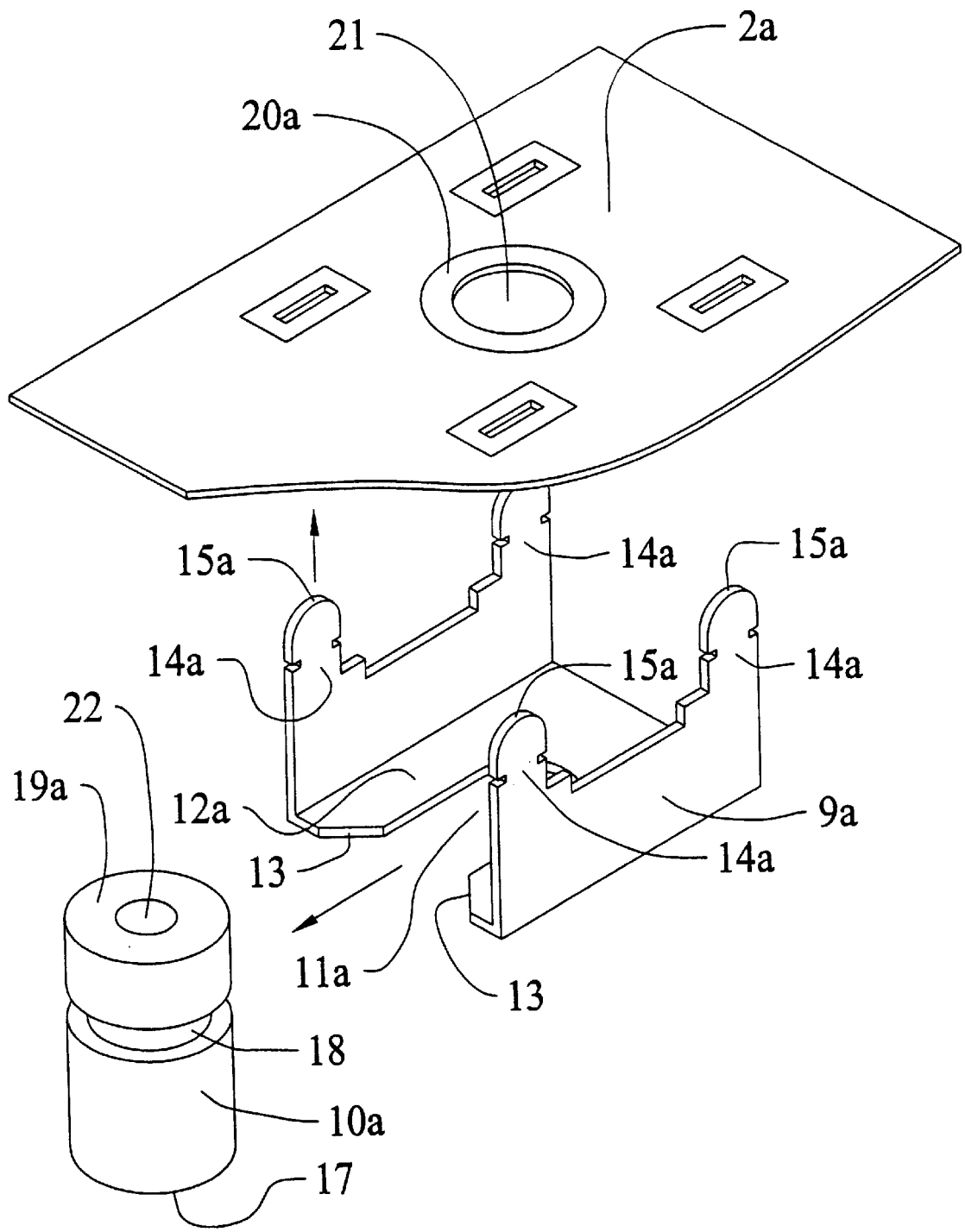
FIG. 4 is an exploded perspective view of the embodiment of the apparatus illustrated in FIG. 2.

The bracket 9a is illustrated in FIGS. 2–4. The bracket may be formed from any material capable of deforming as necessary to make the connection disclosed herein without breaking. Examples of such a material include ferrous metals, beryllium copper, aluminum, tin, and certain plastics. Plastics that are non-conductive may only be used in embodiments where grounding of the motherboard 2a is not accomplished through the bracket 9a. As best seen in FIG. 4, the bracket 9a has a notch 11a in a first side 12a. The notch 11a may have chamfered edges 13 at its mouth in order to more easily slidably engage with the mounting boss 10a. The bracket 9a may also have a tab 14a with a first end 15a. The tab 14a is for coupling the bracket 9a to the motherboard 2a. The first end 15a of the tab 14a is for deforming to create a fixed coupling between the tab and the motherboard 2a as illustrated in FIGS. 2 and 3. One way of deforming the first end 15a is to twist the end in a direction 16 as illustrated in FIG. 2. The first end 15a could also be deformed by bending the tab 14a about one of its linear axes or by compressing the first end 15a. Any means of deforming the tab 14a would be adequate so long as the tab secures the motherboard 2a against the bracket 9a.

In some embodiments, the first end is also employed to make electrical contact between itself and a conductive area 17a on the motherboard 2a. The conductive area 17a is an electrically conductive material applied to the motherboard 2a that is also electrically connected to parts of the motherboard that require grounding through the bracket 9a. As is illustrated in FIGS. 2 and 4, an embodiment of the invention may use four tabs 14a for coupling the bracket 9a to the motherboard 2a.

Mounting Boss

The mounting boss 10a shown in FIGS. 2–4 is for slidably engaging the bracket 9a. The mounting boss 10a may be generally cylindrically shaped. As best viewed in FIG. 4, the general shape of the mounting boss 10a may be cylindrical with a substantially upright mounting of the cylinder on a chassis. The chassis is not illustrated in FIG. 4, but would be coupled to a base 17 of the mounting boss 10a. In embodiments of the invention, electrical connection is made between the mounting boss 10a and the chassis for providing electrical grounding to the chassis.

As illustrated in FIGS. 3 and 4, the mounting boss 10a has an intermediate portion of reduced dimension 18 for accepting the bracket 9a in sliding engagement. In the embodiment illustrated, the part of the bracket engaging the intermediate portion of reduced dimension 18 is the notch 11a. In embodiments where the electrical connection is made between the bracket 9a and the motherboard 2a, electrical connection between the bracket and the mounting boss 10a is made at the position of sliding engagement 23 shown in FIG. 3. The structure of the bracket 9a in relation to the motherboard 2a and the position of sliding engagement 23 also tends to force a first end 19a of the mounting boss 10a against the lower surface of the motherboard 2a.

The first end 19a of mounting boss 10a is for contacting the motherboard 2a to provide an electrical connection between the mounting boss and the motherboard. A conductive surface 20a is provided on one or both sides of the motherboard 2a. The conductive surface extends radially onto both sides of the motherboard 2a about an opening 21 in the motherboard. The mounting boss 10a may include a hole 22 in the first end 19a for accepting a screw. By this arrangement, electrical connection may be made between the motherboard 2a and the mounting boss 10a by two means. First, with a standard off-the-shelf motherboard, a screw placed through the motherboard will make electrical connection with both the mounting post 10a and the conductive surface 20a on the top side of the motherboard. Additionally, the screw will force the conductive surface 20a on the bottom side of the motherboard against the first end 19a of the mounting post 10a.

Second, with a specially manufactured motherboard as illustrated in FIGS. 2–4, sliding engagement of the bracket 9a onto the mounting boss 10a will force the conductive surface 20a on the bottom side of the motherboard 2a against the first end 19a of the mounting post 10a. In some embodiments, the bracket structure illustrated and an additional connection with a screw could be used to give added security and conductivity to the connection.

Description of a Second Embodiment of the Invention

Figure 5:
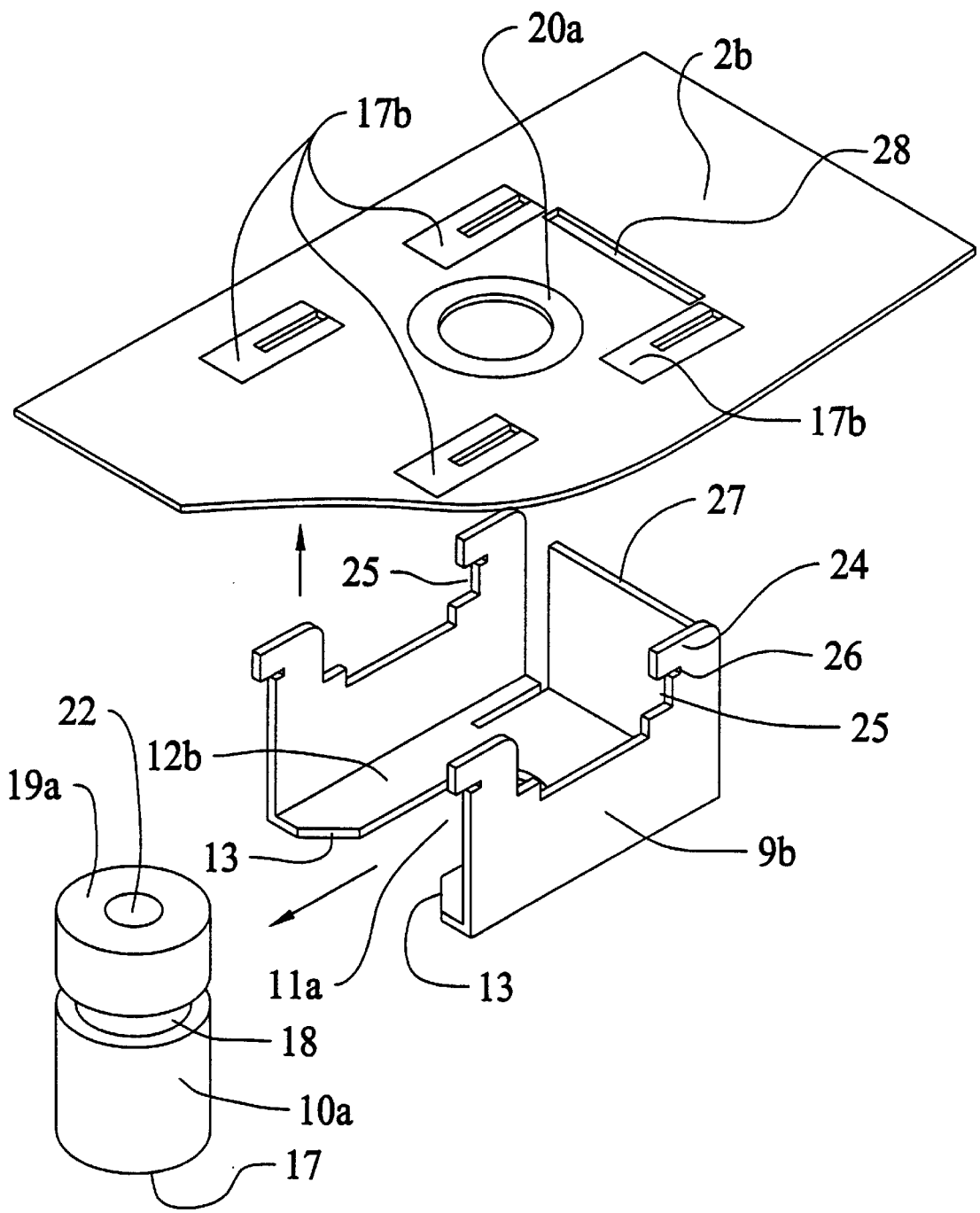
FIG. 5 is an exploded perspective view of another embodiment of the apparatus.
Figure 6:
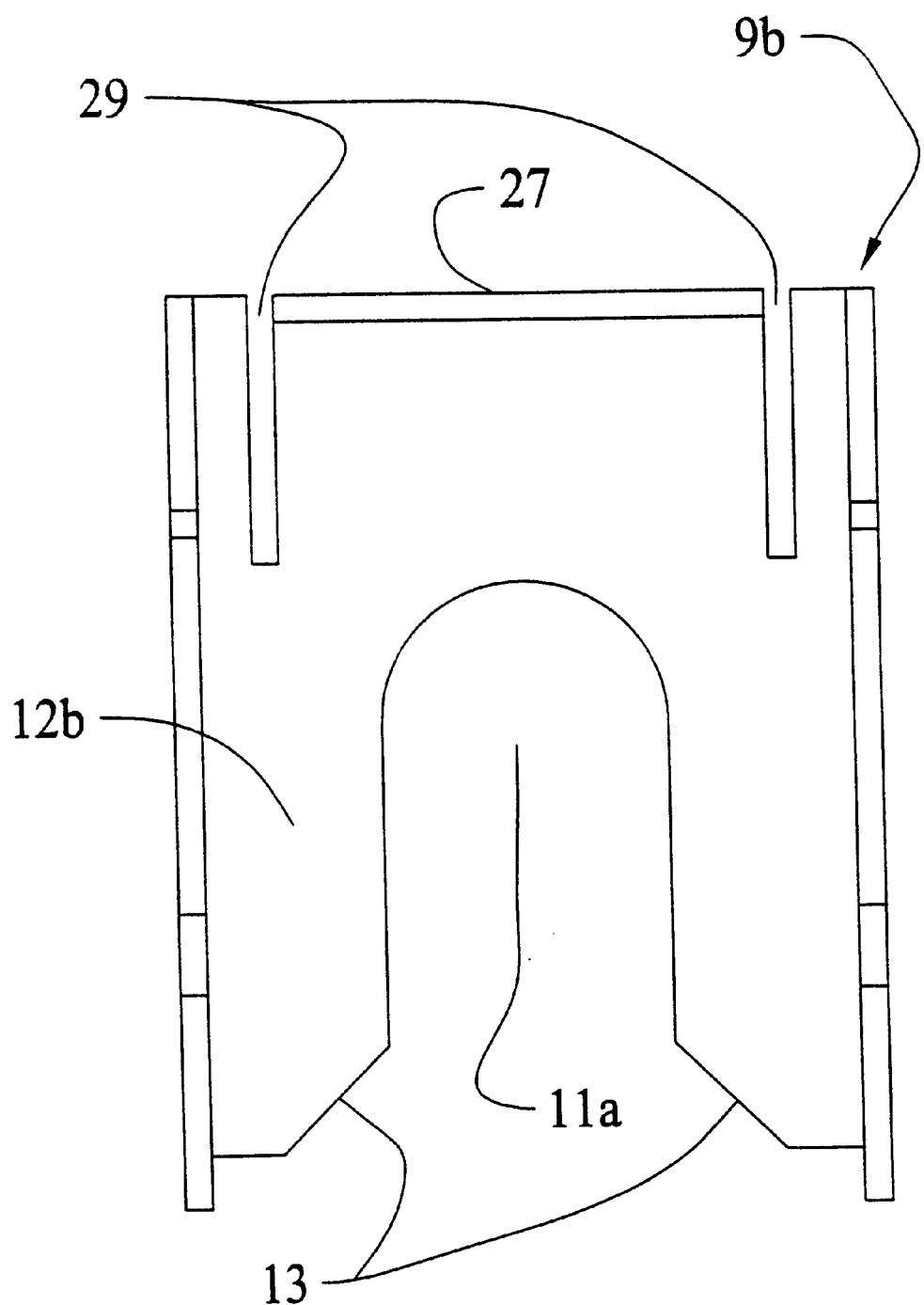
FIG. 6 is a plan view of a bracket of the embodiment illustrated in FIG. 5.

FIGS. 5 and 6 illustrate an embodiment of the invention in which a bracket 9b may be coupled to a motherboard 2b to support the motherboard. The motherboard 2b could be any kind of circuit board, but in this embodiment is a motherboard. Additionally, a mounting boss 10a is illustrated. The mounting boss 10a slidably engages around the bracket 9b. The mounting boss 10a is located on only one side of the motherboard 2b when the mounting boss is engaged with the bracket 9b.

Bracket

The bracket 9b is illustrated in FIGS. 5 and 6. In some embodiments, the bracket may be formed from any material capable of formation into the shape illustrated. In other embodiments the bracket may be formed from any material capable of deforming as necessary to make the connection disclosed herein without breaking. Examples of such a material include ferrous metals, beryllium copper, aluminum, tin, and certain plastics. Plastics that are non-conductive may only be used in embodiments where grounding of the motherboard 2b is not accomplished through the bracket 9b. The bracket 9b has a notch 11a and chamfered edges 13 substantially identical to the components described in association with the first embodiment. The bracket 9b may also have a hook 24 for coupling to the circuit board. The hook 24 may also have a notch 25 greater than the thickness of the motherboard 2b for slidably coupling with the motherboard. The hook 24 may include a bending cut 26 which facilitates the deforming of the hook 24 in a manner similar to the first end 15a of the tab 14a as described in the first embodiment. As in the first embodiment, any means of deforming the hook 24 could be adequate so long as the deformed hook secures the motherboard 2b against the bracket 9b.

As illustrated in FIGS. 5 and 6, the bracket 9b includes a locking stem 27 for engaging a locking slot 28 in the motherboard 2b. The locking stem 27 is coupled to a first surface 12b of the bracket 9b. In some embodiments, at least a portion of the locking stem extends substantially perpendicularly from the first surface 12b. The first surface 12b is slotted with two slots 29 so that the locking stem 27 will be able to flex away from the motherboard 2b when being moved into position and then recoil into locking slot 28 when aligned.

In some embodiments, the hook 24 is also employed to make electrical contact with a conductive area 17b on the motherboard 2b. The conductive area 17b is an electrically conductive material applied to the motherboard 2b. The conductive area 17b is also electrically connected to parts of the motherboard that require grounding through the bracket 9b. As is illustrated embodiments of the invention may use four hooks for coupling the bracket 9b to the motherboard 2b.

Mounting Boss

The mounting boss 10a shown in FIGS. 5 and 6 is substantially identical to the mounting boss described above and illustrated in FIGS. 2–4. Similarities persist in both physical shape and connection and electrical connectivity. As with the mounting boss described above, the combination of the hole 22 and the intermediate portion of reduced dimension 18 provide for mechanical and electrical connection of both off-the-shelf motherboards and specially manufactured motherboards. The specially manufactured motherboards may provide simplified connection and removal through the structure disclosed. The motherboard to mounting post interface is substantially identical as well.

Description of a Third Embodiment of the Invention

Figure 7:
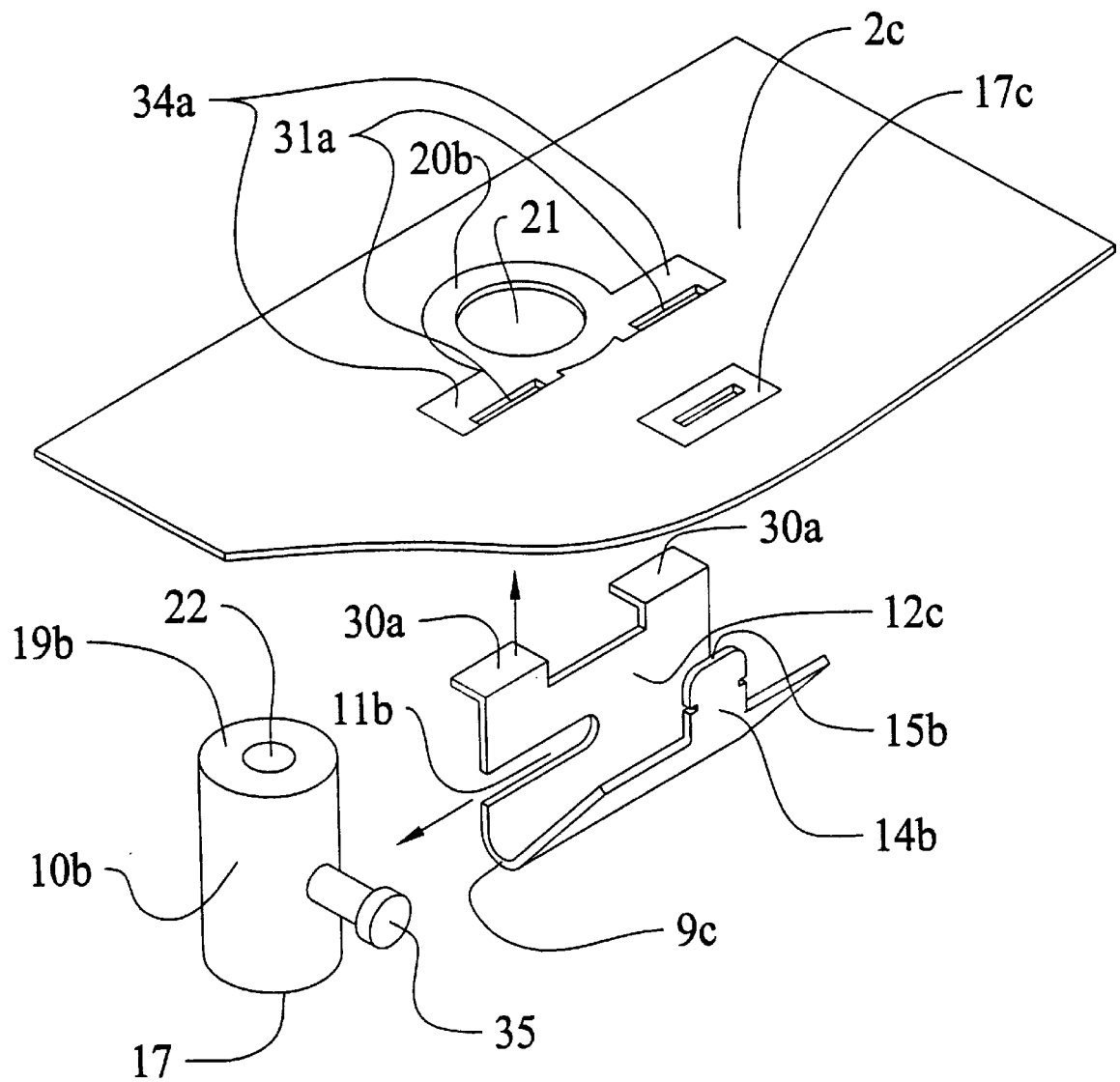
FIG. 7 is an exploded perspective view of still another embodiment of the apparatus.

FIG. 7 illustrates a third embodiment of the invention in which a bracket 9c may be coupled to a motherboard 2c to support the motherboard. The motherboard 2c could be any kind of circuit board, but in this embodiment is a motherboard. Additionally, a mounting boss 10b is illustrated. The mounting boss 10b is for slidably engaging the bracket 9c. The mounting boss 10b is located on only one side of the motherboard 2c when the mounting boss is engaged with the bracket 9c.

Bracket

The bracket 9c is illustrated in FIG. 7. The bracket may be formed from any material capable of deforming as necessary to make the connection disclosed herein without breaking. Examples of such a material include ferrous metals, beryllium copper, aluminum, tin, and certain plastics. Plastics that are non-conductive may only be used in embodiments where grounding of the motherboard 2c is not accomplished through the bracket 9c. The bracket 9c has a notch 11b in a first surface 12c. The bracket 9c may also have a tab 14b with a first end 15b. The tab 14b is for coupling the bracket 9c to the motherboard 2c. The first end 15b of the tab 14b is for deforming to create a fixed coupling between the tab and the motherboard 2c as illustrated in FIG. 7. One way of deforming the first end 15b is to twist the end. The first end 15b could also be deformed by bending the tab 14b about one of its linear axes or by compressing the first end 15b. Any means of deforming the tab 14b would be adequate so long as the tab secures the motherboard 2c against the bracket 9c.

As shown in FIG. 7, the bracket 9c may include a shear tab 30a extending from the first surface 12c. The shear tab is for coupling with a shear tab slot 31a in the motherboard 2c. In embodiments of the invention the shear tab 30a extends substantially perpendicularly from the first surface 12c.

In some embodiments, the first end 15b is also employed to make electrical contact with a conductive area 17c on the motherboard 2c. The conductive area 17c is an electrically conductive material applied to the motherboard 2c that is also electrically connected to parts of the motherboard that require grounding through the bracket 9c. In a similar manner, the shear tabs 30a may be used to make electrical contact with an additional conductive area 34a. The additional conductive area 34a is also an electrically conductive material applied to the motherboard 2c that is electrically connected to parts of the motherboard that require grounding through the bracket 9c. Therefore, the first end 15b and the shear tabs 30a may provide alternate or concurrent paths of electrical grounding.

Mounting Boss

The mounting boss 10b shown in FIG. 7 is for slidably engaging the bracket 9c. The mounting boss 10b may be generally cylindrically shaped. The general shape of the mounting boss 10b may be cylindrical with a substantially upright mounting of the cylinder on a chassis. The chassis is not illustrated, but would be coupled to a base 17 of the mounting boss 10b. In embodiments of the invention, electrical connection is made between the mounting boss 10b and the chassis for providing electrical grounding to the chassis.

As illustrated in FIG. 7, the mounting boss 10b has a mounting post 35 for accepting the bracket 9c in sliding engagement. The mounting post 35 may extend from a side of the mounting boss 10b substantially perpendicularly to the longitudinal axis of the mounting boss. As shown, the mounting post 35 enters into sliding engagement with the notch 11b of the bracket 9c.

A first end 19b of mounting boss 10b is for contacting the motherboard 2c to provide an electrical connection between the mounting boss and the motherboard. A conductive surface 20b is provided on one or both sides of the motherboard 2c. The conductive surface extends radially onto both sides of the motherboard 2c about an opening 21 in the motherboard. The mounting boss 10b may include a hole 22 in the first end 19b for accepting a screw. By this arrangement, electrical connection may be made between the motherboard 2c and the mounting boss 10b by two means. First, with a standard off-the-shelf motherboard, a screw placed through the motherboard will make electrical connection with both the mounting post 10b and the conductive surface 20b on the top side of the motherboard. Additionally, the screw will force the conductive surface 20b on the bottom side of the motherboard against the first end 19b of the mounting post 10b.

Second, with a specially manufactured motherboard as illustrated in FIG. 7, sliding engagement of the bracket 9c onto the mounting boss 10b will force the conductive surface 20b on the bottom side of the motherboard 2c against the first end 19b of the mounting post 10b. In some embodiments, the bracket structure illustrated and an additional connection with a screw could be used to give added security and conductivity to the connection.

Description of a Fourth Embodiment of the Invention

Figure 8:
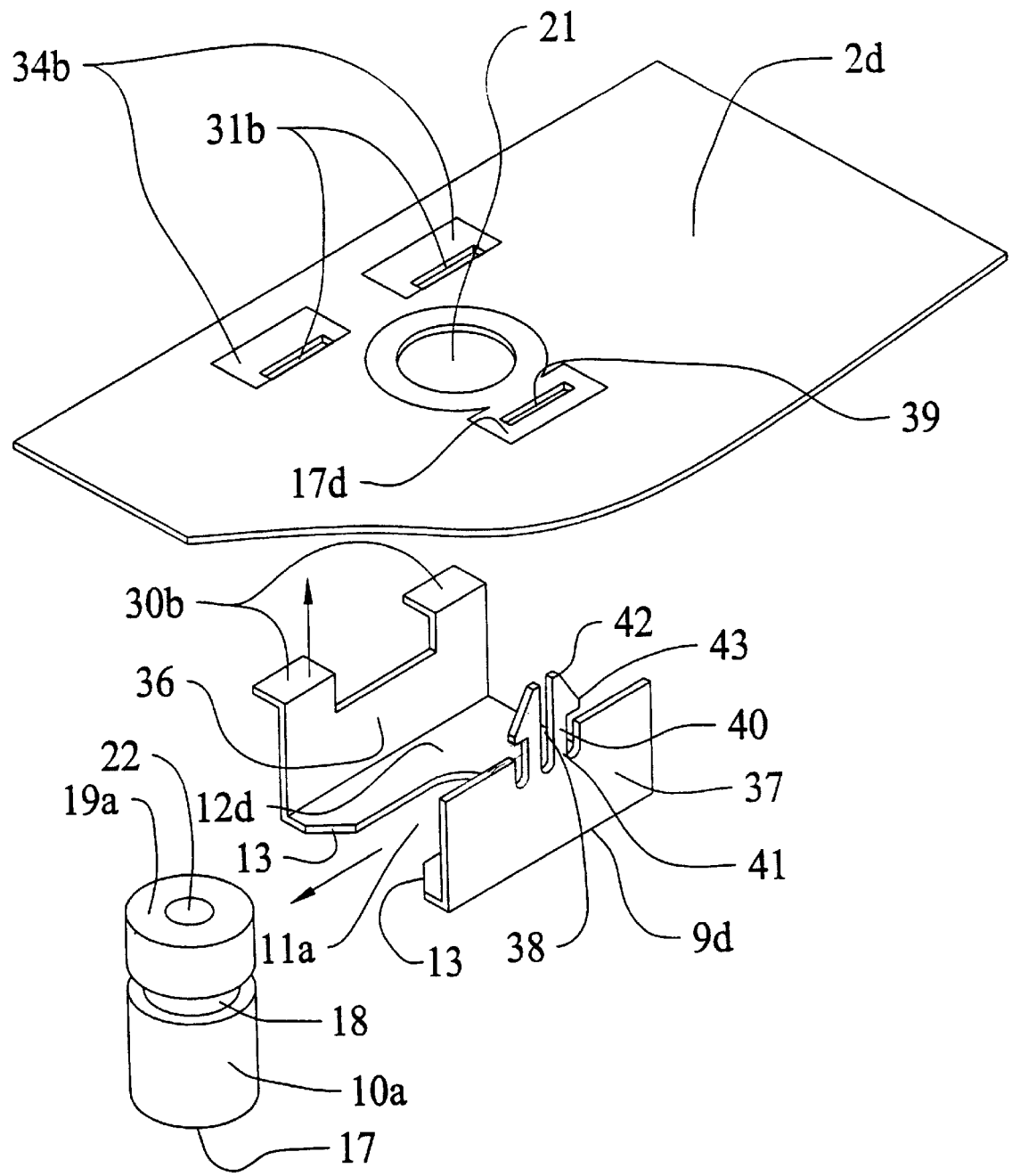
FIG. 8 is an exploded perspective view of yet another embodiment of the apparatus.

FIG. 8 illustrates a fourth embodiment of the invention in which a bracket 9d may be coupled to a motherboard 2d to support the motherboard. The motherboard 2d could be any kind of circuit board, but in this embodiment is a motherboard. Additionally, a mounting boss 10a is illustrated. The mounting boss 10a is for slidably engaging the bracket 9d. The mounting boss 10a is located on only one side of the motherboard 2d when the mounting boss is engaged with the bracket 9d.

Bracket

The bracket 9d is illustrated in FIG. 8. The bracket may be formed from any material capable of formation into the shape illustrated. The bracket 9d has a notch 11a in a first side 12d. The notch 11a may have chamfered edges 13 at its mouth in order to more easily slidably engage with the mounting boss 10a.

Embodiments of the invention may also include a second surface 36 extending substantially perpendicularly from the first surface 12d. As shown in FIG. 8, the bracket 9d may include a shear tab 30b extending from the second surface 36. The shear tab 30b is for coupling with a shear tab slot 31b in the motherboard 2d. In embodiments of the invention the shear tab 30b extends substantially perpendicularly from the second surface 36. A third surface 37 may extend substantially perpendicularly from the first surface 12d on the opposite side for the first surface from the second surface 36. The third surface 37 may also include a compression hook 38 for coupling with a hook slot 39 in the motherboard 2d. As shown in FIG. 8, the compression hook 38 has an elongated leg 40 with a first end 41 and a second end 42. The elongated leg is connected to the main portion of the third surface 37 at its first end 41. A hook catch 43 is connected to the elongated leg 40 at the second end 42. The hook catch 43 is for coupling with and retaining the motherboard 2d. As illustrated the compression hook 38 is composed of two elongated legs.

In some embodiments, the compression hook 38 is employed to make electrical contact with a conductive area 17d on the motherboard 2d. The conductive area 17d is an electrically conductive material applied to the motherboard 2d that is also electrically connected to parts of the motherboard that require grounding through the bracket 9d. In a similar manner, the shear tabs 30b may be used to make electrical contact with an additional conductive area 34b. The additional conductive area 34b is also an electrically conductive material applied to the motherboard 2d that is electrically connected to parts of the motherboard that require grounding through the bracket 9d. Therefore, the compression hook 38 and the shear tabs 30b may provide alternate or concurrent paths of electrical grounding.

Mounting Boss

The mounting boss 10a shown in FIG. 8 is substantially identical to the mounting boss described above and illustrated in FIGS. 2–4. Similarities persist in both physical shape and connection and electrical connectivity. As with the mounting boss described above, the combination of the hole 22 and the intermediate portion of reduced dimension 18 provide for mechanical and electrical connection of both off-the-shelf motherboards and specially manufactured motherboards. The specially manufactured motherboards may provide simplified connection and removal through the structure disclosed. The motherboard to mounting post interface is substantially identical as well.

Description of a Fifth Embodiment of the Invention

FIG. 1 shows an embodiment of the grounding and support structure having additional computer system components. The grounding and support structure may also have a chassis 3 coupled to the mounting boss. The mounting boss is not illustrated in FIG. 1, but may be either mounting boss 10a or mounting boss 10b as described above. The chassis 3 is for providing mechanical support and electrical connectivity for the mounting boss. A power supply 4 is mechanically connected to the chassis 3. The power supply 4 is electrically connected to the chassis by a ground connection. A typical ground connection would pass through a ground wire (not shown) as is well known in the art. A central processing unit 5 is coupled to a circuit board 2. Additionally, a memory module 6 is electrically connected to the central processing unit 5. In some embodiments the connection of the memory module 6 to the central processing unit 5 is through the motherboard 2.

A First Method of Grounding and Supporting a Circuit Board

Figure 9:
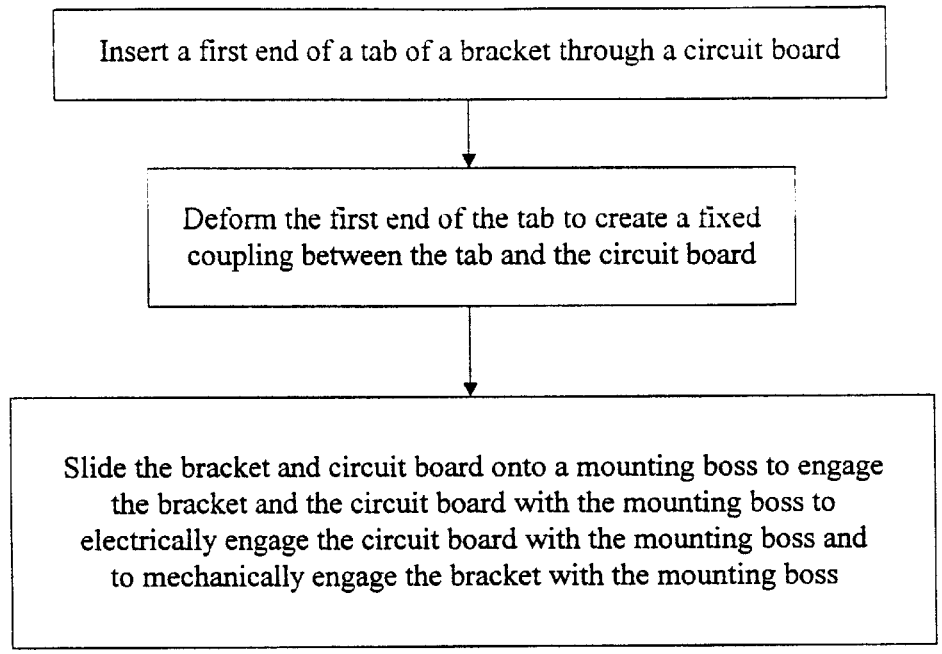
FIG. 9 is a flowchart illustrating an embodiment of the invention consisting of a method of the operation of the apparatus.

An embodiment of the invention is a method of grounding and supporting a circuit board. This first method may be accomplished with the first, third, and fifth embodiments of the invention as illustrated in FIGS. 1–4 and 7. The method is illustrated in a flowchart in FIG. 9. In the first method, a first act is to insert a first end of a tab of a bracket through a circuit board. The first end of the tab is deformed to create a fixed coupling between the tab and the circuit board. As described in detail above, the deformation of the first end of the tab may be by twisting, bending, compressing, or any other operation that couples the bracket to the circuit board. In an additional act, the bracket and circuit board are slid onto a mounting boss to engage the bracket and the circuit board with the mounting boss. In some embodiments of the invention, the act of sliding the bracket and circuit board onto the mounting boss includes the act of electrically engaging the circuit board with the mounting boss and mechanically engaging the bracket with the mounting boss.

A Second Method of Grounding and Supporting a Circuit Board

Figure 10:
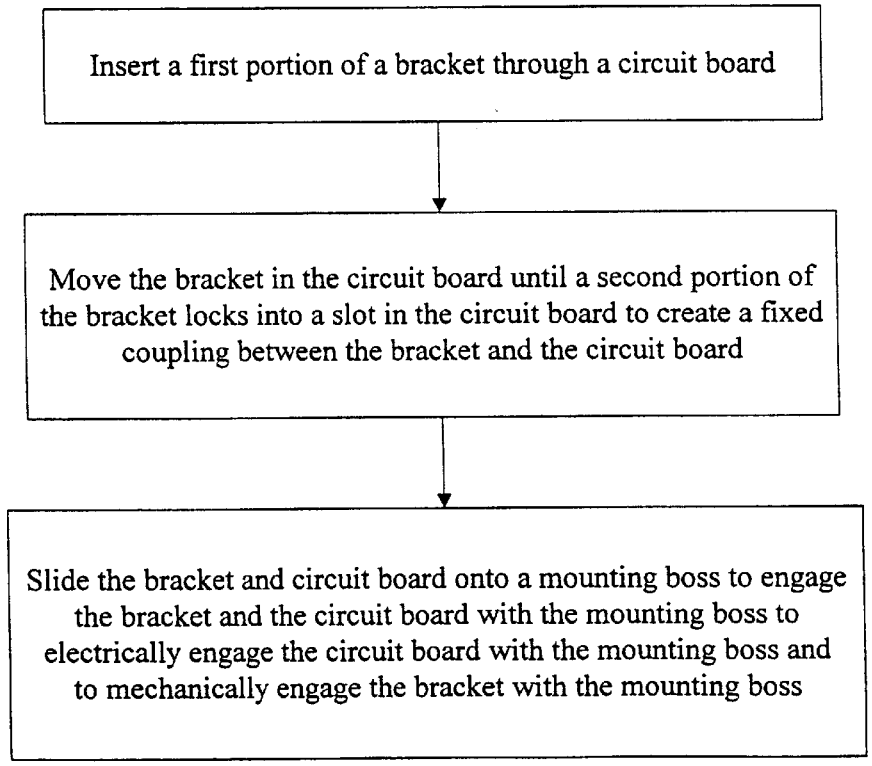
FIG. 10 is a flowchart illustrating an embodiment of the invention consisting of another method of the operation of the apparatus.

Another embodiment of the invention is a second method of grounding and supporting a circuit board. The method may be accomplished with the second, fourth, and fifth embodiments of the invention as illustrated in FIGS. 1, 5, 6, and 8. The method is illustrated in a flowchart in FIG. 10. In the second method, a first act is to insert a first portion of a bracket through a circuit board. The bracket is moved in the circuit board until a second portion of the bracket locks into a slot in the circuit board to create a fixed coupling between the bracket and the circuit board. In another act, the bracket and circuit board are slid onto a mounting boss to engage the bracket and the circuit board with the mounting boss. In some embodiments of the invention, act of sliding the bracket and circuit board onto the mounting boss includes the act of electrically engaging the circuit board with the mounting boss and mechanically engaging the bracket with the mounting boss.

From the foregoing it will be appreciated that, although specific embodiments of the invention have been described herein for purposes of illustration, various modification may be made without deviating from the spirit and scope of the invention. Accordingly, the invention is not limited except as by the claims.

Advantages of the Invention

The unique circuit board grounding and support structure disclosed provides for a device capable of electrically connecting a variety of motherboards to a standard chassis. With embodiments of the invention, a standard chassis may be employed with both off-the-shelf motherboards and specially manufactured motherboards. The invention provides for both electrical grounding and a secure mechanical attachment through a single connection. When used with some types of specially manufactured motherboards, the invention enables attachment of a motherboard without the use of screws or other fasteners that require tools to attach or remove. The invention facilitates an improved device that is both versatile and easy to operate.

What is claimed is:

1. A circuit board grounding and support structure comprising:
    a bracket coupled to a circuit board for supporting the circuit board wherein said bracket includes:
        a tab having a first end, the tab for coupling said bracket to the circuit board, the first end of the tab for deforming to create a fixed coupling between the tab and the circuit board, and
        a notch in a first surface of said bracket; and
    a mounting boss around which said bracket slidably engages, said mounting boss to support said bracket and said circuit board, wherein said mounting boss is generally cylindrically shaped and includes:
        an intermediate portion of reduced diameter for accepting the notch of said bracket in sliding engagement,
        a first end that contacts the circuit board to provide an electrical connection between said mounting boss and the circuit board, and
        a hole in the first end for accepting a screw;
    wherein said mounting boss is located on only one side of the circuit board when said mounting boss is engaged with said bracket.

2. A circuit board grounding and support structure comprising:
    a bracket with a notch, said bracket coupled to a circuit board for supporting the circuit board; and a mounting boss around which said bracket slidably engages in the notch of said bracket;

wherein said mounting boss is located on only one side of the circuit board when said mounting boss is engaged in said bracket.

3. The grounding and support structure of claim 2 wherein said bracket includes a tab having a first end, the tab for coupling said bracket to the circuit board, the first end of the tab for deforming to create a fixed coupling between the tab and the circuit board.

4. The grounding and support structure of claim 2 wherein said bracket includes a hook for slidably coupling to the circuit board.

5. The grounding and support structure of claim 2 wherein said bracket includes a locking stem for engaging a locking slot in the circuit board, the locking stem coupled to a first surface of said bracket.

6. The grounding and support structure of claim 5 wherein at least a portion of the locking stem extends substantially perpendicularly from the first surface of said bracket.

7. The grounding and support structure of claim 2 wherein said bracket includes a shear tab extending from a first surface, the shear tab for coupling with a shear tab slot in the circuit board.

8. The grounding and support structure of claim 7 wherein the shear tab extends substantially perpendicularly from the first surface.

9. The grounding and support structure of claim 2 wherein said bracket includes:

a second surface extending substantially perpendicularly from a first surface, a shear tab extending from a second surface, the shear tab for coupling with a shear tab slot in the circuit board, and a third surface extending substantially perpendicularly from the first surface on the opposite side of the first surface from the second surface.

10. The grounding and support structure of claim 9 wherein the shear tab extends substantially perpendicularly from the second surface.

11. The grounding and support structure of claim 9 wherein the third surface includes a compression hook for coupling with a hook slot in the circuit board.

12. The grounding and support structure of claim 11 wherein the compression hook includes:

an elongated leg having a first end and a second end, the elongated leg connected to the main portion of the third surface at the first end, and a hook catch connected to the elongated leg at the second end, the hook catch for coupling with and retaining the circuit board.

13. The grounding and support structure of claim 2 wherein said mounting boss is generally cylindrically shaped.

14. The grounding and support structure of claim 2 wherein said mounting boss includes an intermediate portion of reduced dimension for accepting said bracket in sliding engagement.

15. The grounding and support structure of claim 2 wherein said mounting boss includes a first end that contacts the circuit board to provide an electrical connection between said mounting boss and the circuit board.

16. The grounding and support structure of claim 15 wherein said mounting boss includes a hole in the first end for accepting a screw.

17. The grounding and support structure of claim 2 wherein electrical connection is made between said bracket and the circuit board for providing electrical grounding to said bracket.

18. The grounding and support structure of claim 17 wherein electrical connection is made between said bracket and said mounting boss at the position of sliding engagement for providing electrical grounding to said mounting boss.

19. The grounding and support structure of claim 18 wherein electrical connection is made between said mounting boss and a chassis for providing electrical grounding to the chassis.

20. The grounding and support structure of claim 2 wherein said mounting boss includes a mounting post for accepting said bracket in sliding engagement.

21. The grounding and support structure of claim 20 wherein the mounting post extends from a side of said mounting boss substantially perpendicularly to the longitudinal axis of said mounting boss.

22. The grounding and support structure of claim 2 further comprising:

a chassis coupled to said mounting boss for providing mechanical support and electrical connectivity for said mounting boss, a power supply mechanically connected to the chassis and electrically connected to the chassis by a ground connection, a central processing unit coupled to the circuit board, and a memory module electrically connected to the central processing unit.

23. A circuit board grounding and support structure comprising:

a means for coupling a circuit board to a bracket;

a means for slidably engaging the bracket with a mounting boss to support the bracket and circuit board; and a means for attaching the mounting boss to a computer chassis to provide mechanical support and electrical connectivity for the mounting boss.

\* \* \* \* \*